United States Patent [19]

Ferrier

[11] Patent Number: 6,146,701
[45] Date of Patent: Nov. 14, 2000

[54] PROCESS FOR IMPROVING THE ADHENSION OF POLYMERIC MATERIALS TO METAL SURFACES

[75] Inventor: Donald Ferrier, Thomaston, Conn.

[73] Assignee: MacDermid, Incorporated, Waterbury, Conn.

[21] Appl. No.: 09/229,019

[22] Filed: Jan. 12, 1999

Related U.S. Application Data

[63] Continuation-in-part of application No. 09/182,566, Oct. 29, 1998, abandoned, which is a continuation of application No. 08/873,992, Jun. 12, 1997, Pat. No. 5,869,130.

[51] Int. Cl.⁷ ........................................................ B05D 3/00
[52] U.S. Cl. .......................... 427/327; 427/333; 427/337; 148/282; 148/283
[58] Field of Search ..................................... 427/327, 333, 427/337; 148/273, 277, 282, 283

[56] References Cited

U.S. PATENT DOCUMENTS

| | | |
|---|---|---|
| 4,051,057 | 9/1977 | Ericson et al. . |
| 4,175,964 | 11/1979 | Uchida et al. ........................... 430/253 |
| 4,409,037 | 10/1983 | Landau . |
| 4,512,818 | 4/1985 | Valayil et al. ..................... 148/6.14 R |
| 4,619,871 | 10/1986 | Takami . |
| 4,642,161 | 2/1987 | Akahoshi et al. . |
| 4,775,444 | 10/1988 | Cordani . |
| 4,844,981 | 7/1989 | Landau . |
| 4,902,551 | 2/1990 | Nakaso et al. . |
| 4,981,560 | 1/1991 | Kajihara et al. . |
| 4,997,516 | 3/1991 | Adler . |
| 4,997,722 | 3/1991 | Adler . |
| 5,259,979 | 11/1993 | Condra et al. .......................... 252/79.2 |
| 5,289,630 | 3/1994 | Ferrier et al. . |
| 5,366,814 | 11/1994 | Yamanishi et al. . |
| 5,532,094 | 7/1996 | Arimura et al. ........................ 252/79.1 |
| 5,550,006 | 8/1996 | Larson et al. . |
| 5,712,047 | 1/1998 | Aso et al. . |
| 5,800,859 | 9/1998 | Price et al. ................................. 427/98 |
| 5,802,714 | 9/1998 | Kobayashi et al. ........................ 29/852 |
| 5,900,256 | 5/1999 | Scoville, Jr. et al. ................... 424/616 |

FOREIGN PATENT DOCUMENTS

| | | |
|---|---|---|
| 0442197A2 | 8/1991 | European Pat. Off. . |
| 0670379A1 | 2/1995 | European Pat. Off. . |
| 0696651A1 | 2/1996 | European Pat. Off. . |
| 0757118A1 | 2/1997 | European Pat. Off. . |
| 0887439A1 | 12/1998 | European Pat. Off. . |
| 57-116775 | 7/1982 | Japan . |
| 1-1240683 | 9/1989 | Japan . |
| 3-079778 | 4/1991 | Japan . |
| 06057453 | 3/1994 | Japan . |
| 6-192855 | 7/1994 | Japan . |
| 10-0056263 | 2/1998 | Japan . |
| WO94/16120 | 7/1994 | WIPO . |
| WO96/19097 | 6/1996 | WIPO . |

OTHER PUBLICATIONS

A. G. Osborne—An Alternate Route to Red Oxide for Inner Layers—P.C. Fabrication Magazine Aug., 1984.

*Primary Examiner*—Shrive Beck
*Assistant Examiner*—Jennifer Calcagni
*Attorney, Agent, or Firm*—Carmody & Torranc LLP

[57] ABSTRACT

A process is described for treating metal surfaces with a composition comprising an oxidizer, an acid, a corrosion inhibitor, a source of halide ions, a source of adhesion enhancing ions selected from the group consisting of molybdates, tungstates, tantalates, niobates, vanadates and mixtures thereof and optionally a water soluble polymer in order to increase the adhesion of polymeric materials to the metal surface.

13 Claims, No Drawings

PROCESS FOR IMPROVING THE ADHENSION OF POLYMERIC MATERIALS TO METAL SURFACES

This application is a continuation-in-part of U.S. patent application Ser. No. 09/182,566 filed on Oct. 29, 1998, abandoned, which is a continuation of U.S. patent application Ser. No. 08/873,992 filed on Jun. 12, 1997, now U.S. Pat. No. 5,869,130.

BACKGROUND OF THE INVENTION

The present invention relates to printed circuits, and more particularly to a process for fabricating a multilayer printed circuit.

Printed circuits containing one or more circuitry innerlayers are in prominent use today as demand increases for further and further weight and space conservation in electronic devices.

In the typical fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuit by interposing one or more partially-cured dielectric substrate material layers (so-called "per-preg" layers) between the circuitry innerlayers to form a composite of alternating circuitry innerlayers and dielectric substrate material. The composite is then subjected to heat and pressure to cure the partially-cured substrate material and achieve bonding of circuitry innerlayers thereto. The so-cured composite will then have a number of through-holes drilled therethrough, which are then metallized to provide a means for conductively interconnecting all circuitry layers. In the course of the through-hole metallizing process, desired circuitry patterns also typically will be formed on the outer-facing layers of the multilayer composite.

An alternate approach to the formation of a multilayer printed circuit board is through additive or surface laminer circuitry techniques. These techniques begin with a non-conductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August, 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are included herein by reference in their entirety, involving oxides formed from relatively high chlorite/relatively low caustic copper oxidizing compositions, and producing substantially improved results in circuitry innerlayer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g. through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multi-layer assembly employing such circuitry innerlayers will not evidence pink ring formation since there is no copper oxide present for localized dissolution, and localized exposure of underlying copper, in subsequent through-hole processing. Here again, however, problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promoting layer of copper oxide is formed on the circuit elements followed by a controlled dissolution and removal of a substantial amount of the copper oxide in a manner which does not adversely affect the topography.

PCT Application No. WO 96/19097 to McGrath, the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quatemnary ammonium surfactant.

This invention proposes a process for improving the adhesion of polymeric materials to a metal surface, especially copper or copper alloy surfaces. The process proposed herein is particularly useful in the production of multi layer printed circuits. The process proposed herein provides optimum adhesion between the metallic and polymeric surfaces (ie. the circuitry and the intermediate insulating layer), eliminates or minimizes pink ring and operates economically, all as compared to conventional processes.

SUMMARY OF THE INVENTION

The inventors herein propose a process for improving the adhesion of polymeric materials to metal surfaces, particularly copper and copper alloy surfaces. The proposed process comprises:

1). Contacting the metal surface with an adhesion-promoting composition comprising:
   a) an oxidizer;
   b) an acid;
   c) a corrosion inhibitor;
   d) a source of halide ions; and
   e) a source of adhesion enhancing ions, which ions are selected from the group consisting of molybdates, tungstates, tantalates, niobates, vanadates and mixtures thereof.

2) thereafter bonding the polymeric material to the metal surface.

The inventors have found that the foregoing process improves the adhesion of metal surfaces to the polymeric materials, particularly when the metal surfaces comprise copper or copper alloys. The process proposed is particularly suited to the production of multilayer printed circuit boards.

DETAILED DESCRIPTION OF THE INVENTION

The inventor herein has found that the adhesion between a metal surface and a polymeric material is enhanced by contacting the metal surface with an adhesion-promoting composition prior to bonding the polymeric material to the metal surface. The invention therefore proposes a process for increasing the adhesion of a polymeric material to a metal surface, said process comprising:

1) contacting the metal surface with an adhesion-promoting composition comprising:
   a) an oxidizer;
   b) an acid;
   c) a corrosion inhibitor;
   d) a source of halide ions;
   e) a source of adhesion enhancing ions, which ions are selected from the group consisting of molybdates, tungstates, tantalates, niobates, vanadates and mixtures thereof; and
   f) optionally, a water soluble polymer;

2) thereafter bonding the polymeric material to the metal surface.

The inventors have found that the proposed adhesion-promoting composition produces a micro-roughened conversion-coated surface upon the metal. The surface produced is particularly suited to bonding with polymeric materials in that significantly increased adhesion values are achieved as compared to a non-treated metal surface. In addition the conversion coated (treated) metal surface maintains the increased adhesion over time and decreases the likelihood of any unwanted reactions occurring over time between the metal and the polymeric material.

The process proposed is particularly suited to the manufacture of multilayer printed circuit boards. Thus, in this application, the metal circuitry (usually copper) of the innerlayers is treated with the adhesion-promoting composition proposed herein. After treatment, followed by water rinsing, the innerlayers are bonded together with polymeric materials such as pre-pregs or imageable dielectrics, resulting in the multi layer printed circuit board.

The metal surface to be treated may comprise a variety of metals such as copper, copper alloys, nickel and iron. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The oxidizer used in the adhesion-promoting composition may comprise any oxidizer which is capable of oxidizing the metal surface in the matrix of the adhesion-promoting composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may range from 6 to 60 grams per liter but is preferably from 12 to 30 grams per liter.

The acid utilized in the adhesion-promoting composition may be any acid which is stable in the matrix, however, the inventors have found mineral acids to be particularly preferred. Sulfiric acid is especially preferred. The concentration of the acid in the adhesion-promoting composition may range from 5 to 360 grams per liter but is preferably from 70 to 110 grams per liter.

The corrosion inhibitor used in the adhesion-promoting composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of the foregoing. The concentration of the corrosion inhibitor in the adhesion-promoting composition may range from I to 20 grams per liter but is preferably from 6 to 12 grams per liter.

The source of halide ions may be any compound which would provide halide ions in the matrix of the adhesion-promoting composition. Preferably, the source of halide ions are alkaline metal salts such as sodium chloride or potassium chloride, oxohalides such as sodium chlorate or potassium chlorate, or halide bearing mineral acids such as hydrochloric acid. Preferably the source of halide ions provides chloride ions to the adhesion-promoting composition and most preferably the source of halide ions provides chlorate ions to the adhesion-promoting composition. The concentration of the source of halide ions in the adhesion-promoting composition may range from 5 to 500 milligrams per liter but is preferably from 10 to 50 milligrams per liter, all based on halide ion content.

The source of adhesion enhancing ions can be any material which will supply ions selected from the group consisting of molybdates, tungstates, tantalates, niobates, vanadates and mixtures thereof to the adhesion promoting composition. Such sources include alkali metal salts molybdates, tungstate, tantalates, niobates, vanadates and mixtures thereof such as sodium (or potassium) molybdate, tungstate, niobate or vanadate. Preferred sources include iso and hetero polyacids of molylodenum, tungsten, niobium, vanadium and mixtures thereof such as molybdic acid, vanadic acid and tungsten acid. The most preferred source of adhesion enhancing ions is molybdic acid. The concentration of adhesion enhancing ions in the adhesion promoting composition may range from 1 mg/l to 500 mg/l (based on the adhesion enhancing ion content) but is preferably from 5 mg/ to 200 mg/l.

Optionally, but preferably, the adhesion-promoting composition also comprises a water soluble polymer. Preferably the water soluble polymer is not a wetter or surfactant but is instead a water soluble homopolymer or copolymer of low molecular weight water soluble monomers. Most preferably, the water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide company under the tradename Carbowax. The inventors have found Carbowax 750 and Carbowax MPEG 2000 to be particularly useful. Also particularly useful are the ethylene oxide polymers or ethylene oxide-propylene oxide copolymers sold by the BASF company under the Pluronic tradename. The concentration of the water soluble polymer in the adhesion-promoting composition can range from 1 to 15 grams per liter, but is preferably from 3 to 6 grams per liter.

The metal surface can be treated with the adhesion-promoting composition in a variety of ways, including immersion, spray, or flood. The temperature of the adhesion-promoting composition during treatment may range from 80° F. to 150° F. but is preferably from 90° F. to 120° F. The treatment time will vary depending upon the temperature and method of treatment but may range from 15 seconds to 15 minutes and is preferably from 1 to 2 minutes.

The following examples are illustrative of the invention but should not be taken as limiting:

EXAMPLE 1

A copper treatment solution consisting of 4.6% by volume sulfuric acid, 2.8% by volume of 50% hydrogen peroxide, 6.3 g/L benzotriazole, approximately 15 mg/L sodium chloride, approximately 1 g/L Carbowax MPEG 2000 polyethylene oxide, and 21.6 g/L copper ion (in order to simulate an aged or used adhesion promoting composition eg. as the adhesion promoting composition is utilized with copper surfaces copper ions build in the solution) was heated to approximately 95° F. A fresh predip solution consisting of 2 g/L benzotriazole and 2% by volume of 50% hydrogen peroxide was made up. A copper clad resin panel approximately 1.5 inches wide by 3 inches high was weighed and run through the following treatment cycle:

| | |
|---|---|
| Metex 9271 Acid Cleaner,* 10%, 125° F. | 2 minutes |
| Cold Water Rinse | 2 minutes |
| Predip, Room Temperature | 1 minute |
| Copper Treatment Solution, 95° F. | 1 minute |
| Cold Water Rinse | 1 minute |
| Forced Air Dry | |

*Available from MacDermid, Incorporated of Waterbury, CT.

After treatment the panel had a purple/tarnish surface appearance. The panel was weighed and the approximate thickness of copper removed from the surface was calculated from the weight loss. A copper clad resin panel and a copper foil of one ounce thickness were then run through the same cycle. 50 mg/L molybdic acid were then added to the copper treatment solution and the experiment was repeated. Further additions of 50 mg/L molybdic acid were made, with the appropriate experiments being run after each addition, to a total addition of 150 mg/L molybdic acid. The matching cores and foils were laminated together with Nelco 4205-2 glass/epoxy B stage. Following lamination the panels were etched to provide one inch wide strips on the foil side, baked and immersed in tin/lead solder at 550° F. for zero, ten and twenty seconds. Peel strengths were then determined on each panel after the solder immersion. The following results were obtained:

| Run | Etch | 0 Sec Solder | 10 Sec Solder | 20 Sec Solder |
| --- | --- | --- | --- | --- |
| 0 mg/L Molybdic Acid | 65 μin | 3.2 lb/in | 3.2 lb/in | 2.0 lb/in |
| 50 mg/L Molybdic Acid | 70 μin | 4.2 lb/in | 4.2 lb/in | 3.5 lb/in |
| 100 mg/L Molybdic Acid | 65 μin | 4.8 lb/in | 4.5 lb/in | 4.0 lb/in |
| 150 mg/L Molybdic Acid | 65 μin | 5.0 lb/in | 4.8 lb/in | 4.8 lb/in |

Increasing molybdic acid concentration in this system clearly provides an increase in copper/resin peel strength for both unsoldered and solder stressed conditions.

EXAMPLE 2

A copper treatment solution comprising approximately 3% by volume of sulfuric acid, 0.75% by volume of 50% hydrogen peroxide, 8 g/L benzotriazole and 30 mg/L potassium chloride was made up. A predip of 2 g/L benzotriazole and 1% by volume of 50% hydrogen peroxide was also made up. Etch rate panels and cores and foils were run through the cycle of Example 1, substituting the present treatment bath and predip for the treatment bath and predip used in Example 1. Runs were made at treatment bath temperatures of approximately 100° F. An addition of 10 mg/L molybdic acid was then made to the treatment bath and the experiments were repeated. After treatment the cores and foils were laminated, etched, baked and immersed in solder as in Example 1. The following results were observed:

| Run | Etch | 0 Sec Solder | 10 Sec Solder | 20 Sec Solder |
| --- | --- | --- | --- | --- |
| 0 mg/L Molybdic Acid, 100° F. | 20 μin | 4.0 lb/in | 3.8 lb/in | 3.0 lb/in |
| 10 mg/L Molybdic Acid, 100° F. | 18 μin | 5.2 lb/in | 4.5 lb/in | 4.0 lb/in |
| 0 mg/L Molybdic Acid, 110° F. | 25 μin | 4.8 lb/in | 4.5 lb/in | 3.0 lb/in |
| 10 mg/L Molybdic Acid, 110° F. | 25 μin | 5.8 lb/in | 4.5 lb/in | 3.5 lb/in |
| 0 mg/L Molybdic Acid, 120° F. | 25 μin | 5.5 lb/in | 4.2 lb/in | 3.2 lb/in |
| 10 mg/L Molybdic Acid, 120° F. | 25 μin | 6.2 lb/in | 5.2 lb/in | 3.2 lb/in |

Again, it is clear that addition of the molybdate ion to the copper treatment solution gives an improvement in bonding of copper to resin.

what is claimed is:

1. A process for increasing the adhesion of a polymeric material to a metal surface, wherein the metal surface comprises copper or coppper alloy, said process comprising:
   a.) contacting the metal surface with an adhesion-promoting composition comprising:
   1. from about 6 to 60 grams per liter of an oxidizer;
   2. from about 5 to 360 grams per liter of an acid;
   3. from about 1to 20 grams per liter of a corrosion inhibitor;
   4. from about 5 to 500 milligrams per liter of halide ions;
   5. a source of adhesion enhancing ions, which ions are selected from the group consisting of molybdates, tungstates, tantalates, niobates, vanadates and mixtures thereof, wherein the concentration of adhesion enhancing ions in the adhesion-promoting composition ranges from about 1 to 500 milligrams per liter; and
   6. optionally, a water soluble polymer, wherein the concentration of water soluble polymer in the adhesion-promoting composition, if used, ranges from about 1 to 15 grams per liter; and thereafter
   b.) bonding the polymeric material to the metal surface.

2. A process according to claim 1 wherein the oxidizer is selected from the group consisting of hydrogen peroxide and persulfates.

3. A process according to claim 1 wherein the adhesion enhancing ions comprise molybdate ions.

4. A process according to claim 1 wherein the corrosion inhibitor is selected from the group consisting of triazoles, benzotriazoles, imidazoles, benzimidazoles, tetrazoles and mixtures of the foregoing.

5. A process according to claim 1 wherein the water soluble polymer is selected from the group consisting of polymers of ethylene oxide, ethylene oxide-propylene oxide copolymers, polyethylene glycols, polypropylene glycols, polyvinyl alcohols, and mixtures of the foregoing.

6. A process according to claim 1 wherein the concentration of the oxidizer ranges from about 12 to 30 grams per liter, the concentration of the acid ranges from about 70 to 110 grams per liter, the concentration of the corrosion inhibitor ranges from about 6 to 12 grams per liter, the concentration of the halide ions ranges from about 10 to 50 milligrams per liter and the concentration of the adhesion enhancing ions ranges from 5 to 200 milligrams per liter.

7. A process according to claim 2 wherein the adhesion enhancing ions comprise molybadate ions.

8. A process according to claim 6 wherein the corrosion inhibitor is selected from the group consisting of triazoles, benzotriazoles, imidazoles, tetrazoles, benzimidazoles, and mixtures of the foregoing.

9. A process according to claim 8 wherein the acid is a mineral acid.

10. A process according to claim 9 wherein the water soluble polymer is selected from the group consisting of polymers of ethylene oxide, ethylene oxide-propylene oxide copolymers, polyethylene glycols, polypropylene glycols, polyvinyl alcohols, and mixtures of the foregoing.

11. A process according to claim 9 wherein the source of halide ions is selected from the group consisting of alkaline metal halide salts and oxohalide salts.

12. A process according to claim 9 wherein the source of halide ions is a source of chloride ions.

13. A process according to claim 10 wherein the source of halide ions is a source of chlorate ions.

\* \* \* \* \*